United States Patent [19]

Todd

[11] Patent Number: 5,654,081
[45] Date of Patent: Aug. 5, 1997

[54] INTEGRATED CIRCUIT ASSEMBLY WITH POLYMERIC UNDERFILL BODY

[75] Inventor: Michael G. Todd, South Lyon, Mich.

[73] Assignee: Ford Motor Company, Dearborn, Mich.

[21] Appl. No.: 498,207

[22] Filed: Jul. 5, 1995

[51] Int. Cl.$^6$ ........................................ B32B 9/00
[52] U.S. Cl. .................. 428/209; 428/355; 428/344; 252/62.3 T; 252/62.3 Q; 523/211; 525/95; 525/119; 525/122; 525/476; 525/531
[58] Field of Search ................... 252/33.2, 62.3, 252/62.3 T, 62.3 Q; 437/209; 523/211; 525/531, 105, 119, 122, 476, 95; 428/209, 344, 355

[56] References Cited

U.S. PATENT DOCUMENTS

| | | | |
|---|---|---|---|
| 3,329,652 | 7/1967 | Christie et al. | 260/47 |
| 3,438,937 | 4/1969 | Christie et al. | 260/47 |
| 3,538,039 | 11/1970 | Lantz et al. | 260/37 |
| 3,828,066 | 8/1974 | Porret et al. | 260/309.6 |
| 3,919,348 | 11/1975 | Foster et al. | 260/837 R |
| 4,069,203 | 1/1978 | Carey et al. | 260/47 EC |
| 4,492,789 | 1/1985 | Nakashima et al. | 525/531 |
| 4,562,227 | 12/1985 | Rogler et al. | 524/786 |
| 5,089,440 | 2/1992 | Christie et al. | 437/209 |
| 5,109,067 | 4/1992 | Dae et al. | 525/101 |
| 5,218,063 | 6/1993 | Kimball | 525/531 |
| 5,244,939 | 9/1993 | Yasuda et al. | 523/211 |

*Primary Examiner*—Patrick Ryan
*Assistant Examiner*—Cathy F. Lam
*Attorney, Agent, or Firm*—Lorraine S. Melotik; Roger L. May

[57] ABSTRACT

In a method of producing an integrated circuit assembly, an IC device is metallurgically bonded to a supporting substrate. The mounting of the IC device to the substrate also includes a polymeric underfill body adhesively bonding the IC device to the substrate. The polymeric underfill body is formed of a curable underfill composition comprising epoxy resin, anhydride curing agent for the epoxy resin, amine catalyst and a minor amount of an additional component selected from alkyl-substituted imidazole and phenyl-substituted imidazole. Such additional component may act as a catalyst, as used with an amine catalyst known catalyst for the polymerization reaction of the epoxy resin with the anhydride curing agent, may act as a co-catalyst. The polymeric underfill body has improved glass transition temperature values and improved coefficient of thermal expansion values to provide good thermal stress cycling life for the integrated circuit assembly. The additional component, such as N-methyl-imidazole, is used in minor amount, such as from 0.05 to 5.0 weight percent.

6 Claims, 1 Drawing Sheet

INTEGRATED CIRCUIT ASSEMBLY WITH POLYMERIC UNDERFILL BODY

INTRODUCTION

The present invention relates to integrated circuit assemblies, and manufacture of such assemblies, and to a curable underfill composition for use in the manufacture of such assemblies, having improved thermal and dimensional performance properties. More particularly, the invention is directed to an integrated circuit assembly wherein an IC device is mounted to a supporting substrate by metallurgical connections, e.g., solder connections, and a polymeric underfill body.

BACKGROUND

Underfill or encapsulant compositions for mounting integrated circuit (IC) devices are known, including epoxy and phenolic resin formulations typically incorporating hardeners, theological additives, fillers and the like. Such epoxy resin formulations are known to provide a good combination of thermal, mechanical and electrical properties, along with processing ease and relatively low cost. The filler components of such formulations may represent sixty percent by weight or more thereof, serving to enhance the mechanical strength and reduce the coefficient of thermal expansion (CTE) of the cured material. Such flip-chip assembly techniques using an encapsulant material is shown, for example, in U.S. Pat. No. 5,089,440 to Christie et al, the disclosure of which is incorporated herein by reference.

Such encapsulant formulations are used in mounting so-called flip-chip IC devices to a circuit board. (See, for example, *Encapsulants Used in Flip-Chip Packages,* D. Suryanarayana et al, *IEEE Transactions,* Vol. 16, No. 8, December 1993.) Flip-chip processing involves metallurgically bonding an IC device face down to the substrate, that is, with the surface of the IC device from which its electrodes emerge oriented toward the surface of the substrate. Although the metallurgical bonds, formed typically by soldering the IC device electrodes to the substrate such as by Sn—Pb solder for example, or by Au—Au solid diffusion, Au—Sn solid-liquid diffusion or other suitable metallurgical bonding technique, are generally reliable, application of this technology has been somewhat limited due to the potential for inadequate thermal stress durability of the metallurgical bonds during thermal cycling. Thermal stresses are caused by thermal expansion differentials between the substrate, typically glass or other fiber reinforced material such as epoxy or the like, and the silicon or other material of the IC device body. The encapsulant materials are used as a polymeric "underfill" adhesive between the body of the IC device and the substrate to improve the fatigue life of flip-chip assemblies during thermal cycling. Relatively large thermal expansion differentials exist in such flip-chip assemblies with underfill due to the high CTE of known encapsulant formulations. Thermal stresses would be reduced by using a polymeric underfill material having a CTE which matches or more closely approximates that of the metallurgical bonds. In a typical tip-chip assembly, a gold electrode "bump" is used, having a coefficient of thermal expansion approximately 15–17 ppm/°C. Known encapsulant formulations typically exhibit glass transition temperature values in the range of 155°–160° C., with a CTE (below T(g)) of approximately 25–30 ppm/°C. It would be desirable to decrease stresses induced by mismatch of thermal expansion of the materials used in an integrated circuit assembly and increase useful operating temperature of the assembly by employing an underfill composition having lower CTE values and higher glass transition temperature values.

It is an object of the present invention to provide a method of producing an integrated circuit assembly employing a polymeric underfill material having good CTE performance over a large thermal cycling temperature range. Additional objects and aspects of the present invention will be apparent in view of the following disclosure and detailed description of certain preferred embodiments.

SUMMARY

In accordance with a first aspect, a method is provided for producing an integrated circuit assembly. An IC device is metallurgically bonded to a supporting substrate by forming a metallurgical connection between the substrate and one or more electrodes of the IC device. A gap is left between the substrate and the body of the IC device, in which a polymeric underfill body is formed for a more robust mounting of the IC device. The aforesaid gap is filled with a curable underfill composition comprising epoxy resin, anhydride curing agent for the epoxy resin, amine catalyst for the epoxy-anhydride reaction and an mount, preferably a minor amount, of a substituted imidazole additive, preferably being C1 to C7 substituted imidazole, that is, imidazole compounds wherein the substitution groups on the imidazole ring have, in combined total, from one to seven carbons. Most preferably, the substituted imidazole additive is alkyl-substituted imidazole, or phenyl-substituted imidazole. The underfill composition is cured to form a polymeric underfill body having advantageously high glass transition temperature values and low CTE values. The underfill composition can be injected or otherwise filled into the gap between the IC device and the substrate after the IC device has been metallurgically bonded to the substrate. Alternatively, the underfill composition can be added to the IC device or the substrate prior to assembly of the IC device with the substrate.

Those skilled in the art, that is, those who are knowledgeable in this area of technology, will recognize the significant advance provided by the method and novel underfill compositions disclosed here. In accordance with preferred embodiments, commercially available epoxy-based adhesive formulations can be easily and inexpensively modified to achieve unexpected improvements in glass transition temperature values and CTE values, without adversely affecting processing ability. These and additional advantages will be better understand from the following detailed description of certain preferred embodiments.

DETAILED DESCRIPTION OF CERTAIN PREFERRED EMBODIMENTS

Figure 1:
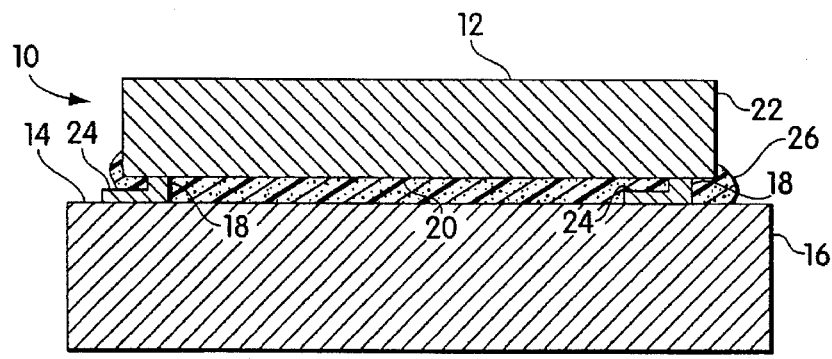
FIG. 1 is a schematic elevation view of a flip-chip type integrated circuit assembly in accordance with a preferred embodiment of the present invention.

An integrated circuit assembly of the flip-chip type is shown in FIG. 1. The assembly 10 is seen to include an IC device 12 which has been mounted "face down" onto upper surface 14 of substrate 16. That is, the leads or electrodes 18 extend from surface 20 of body 22 of the IC device toward the upper surface 14 of the substrate, where they are metallurgically bonded to electrically conductive traces 24 by soldering, thermocompression bonding, ultrasonic bonding, or the like.

It can be seen that there is a gap between surface 14 of the substrate and surface 20 of the IC device body. An underfill body 26 fills the gap, being sandwiched between the IC body and the substrate. It should be understood that the polymeric underfill body formed from the curable underfill composition disclosed here, may differ somewhat from that shown in FIG. 1. It may, for example, entirely envelop the IC device on the substrate. Alternatively, it may not extend out beyond the edges of the IC device. It may appear as a thin, adhesive film sandwiched between the IC device and the substrate. It may contact only upper and side surfaces of the IC device and the substrate. The table below shows the coefficient of thermal expansion for the various parts of such an integrated circuit assembly for operating temperatures below approximately 135° C., using standard encapsulant materials to improve the durability of an IC assembly against the stresses of thermal cycling.

| Material | CTE (ppm/°C.) |
| --- | --- |
| Integrated Circuit Device Silicon Body | 2.5 |
| Au Plated Bump | 15–17 |
| Au/Ni/Cu Trace | 13–17 |
| Printed Circuit Board Substrate | 12–17 |
| Standard Epoxy-based Encapsulant | 25–30 |

The encapsulant CTE values are for a commercially available epoxy-based adhesive material, Hysol® 4511, available from Dexter Corporation, Olean, N.Y.

As noted above, unexpected advantage is achieved in the glass transition temperature and CTE values for epoxy-based encapsulant materials by the use of a minor amount of a substituted imidazole additive. More specifically, in accordance with preferred embodiments, a curable underfill composition comprises epoxy resin and anhydride curing agent for the epoxy resin in about 0.9:1 to 1.1:1 reactive group ratio (i.e., having that milo of reactive groups for the curing reaction), amine catalyst for the curing reaction of the epoxy resin and anhydride curing agent and from 0.05 to 3.0 weight percent of such additive selected from the group consisting of alkyl-substituted imidazole and phenyl-substituted imidazole. Reference here to alkyl substitution of imidazole is intended to mean either mono- or polyalkyl substitution groups on the heterocyclic ring. Preferably the alkyl substitution groups have from one to three carbons, more preferably one or two carbons, and preferably the alkyl substitution group(s) have, in total, from one to four carbons. Preferred imidazoles include, for example, N-methyl-imidazole, 2-ethyl-4-methyl-imidazole, 2-methyl-imidazole, 4-methyl-imidazole, 1,2-dimethyl-imidazole, and 2-phenyl-imidazole. Additional suitable examples will be apparent to those skilled in the art in view of this disclosure and discussion. Also, it will be apparent in view hereof that two or more such compounds can be used in combination. As noted above, this additive is used in only minor amount in the curable underfill composition. Preferably, it is used in an amount of 0.05 to 3.0 weight percent, more preferably 0.1 to 2.0 weight percent As used here, all references to weight percent are based on the total weight of the curable underfill composition, including fillers and the like. Various imidazoles have been used as catalysts in epoxy-based resin adhesives and the like to catalyze, that is, accelerate cross-linking reactions between epoxy reactants and anhydride curing agents. See *Influence of Different Imidazole Catalysts on Epoxy-Anhydride Copolymerization and on Their Network Properties*, N. Bouillon et al, *Journal of Applied Polymer Science*, Vol. 38, pp 2103–2113 (1989). The substituted imidazoles of the underfill compositions disclosed hero were not reported, and are not known, however, to have any significant effect on CTE and glass transition temperature of a cured polymer when combined with amine catalyst to yield a co-catalyst system. The curable underfill composition disclosed here takes advantage of the surprising increase in glass transition temperature and decrease of the CTE achieved by employing such substituted imidazole additive, preferably in minor amount, in conjunction with typical amine catalysts. That is, the aforesaid substituted imidazole additive in minor amount with an amine catalyst provides the unexpected advantage of improved thermal stress fatigue life for integrated circuit assemblies.

Figure 2:
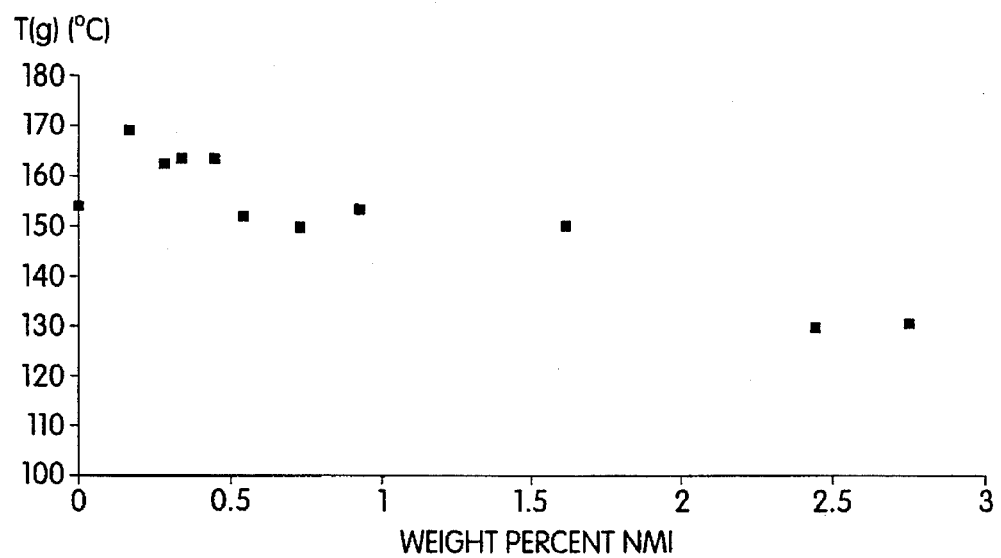
FIG. 2 is a graph showing the glass transition temperature for a polymeric underfill body, shown as a function of the weight percent concentration of N-methyl-imidazole in the curable underfill composition used to form the underfill body.
Figure 3:
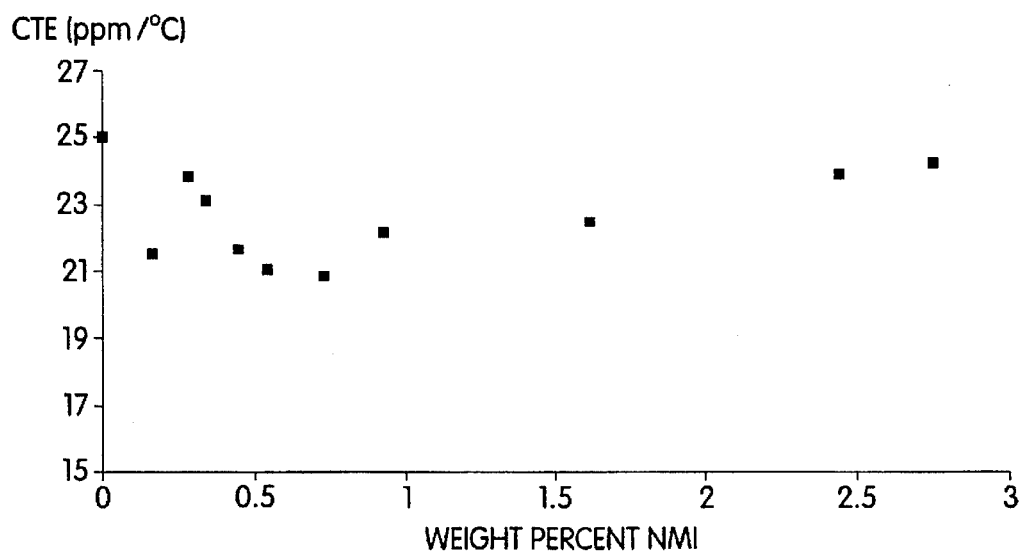
FIG. 3 is a graph showing the coefficient of thermal expansion for a polymeric underfill body in an integrated circuit assembly of the invention, shown as a function of weight percent concentration of N-methyl-imidazole in the curable underfill composition used to form the underfill body.

The advantageous improvement in performance properties achieved by the curable underfill composition of the preferred embodiments is shown graphically in FIGS. 2 and 3. In FIG. 2, the average glass transition temperature (°C.) is shown as a function of the concentration of the aforesaid additional component in the Hysol® 4511 epoxy-based composition mentioned above. The data shown in FIGS. 2 and 3 also includes the glass transition temperature and CTE for the unmodified material, that is, for Hysol® 4511 as commercially available. In all cases the material was cured at 150° C. for fifteen minutes. The data shows that at concentrations between approximately 0.1 weight percent N-methyl-imidazole (NMI) and 0.5 weight percent NMI, the glass transition temperature of the formulation increases well above that of the unmodified system. The peak glass transition temperature of greater than 172° C. was measured for 0.16 weight percent NMI. This represents an increase of more than 15° C. over the unmodified Hysol® 4511. The coefficient of thermal expansion shows a substantial advantageous decrease below that of the unmodified system for NMI concentrations between approximately 0.1 weight percent and 0.75 weight percent The lowest CTE values were obtained between approximately 0.3 weight percent and 0.7 weight percent NMI, with a minimum CTE of approximately 21 ppm/°C. This value is much closer than are the CTE values of known unmodified epoxy encapsulants to the CTE values shown in the table above for components of a typical integrated circuit assembly.

Various commercially available epoxy-based compositions will be readily apparent to those skilled in the art in view of the present disclosure, which are suitable for modification as described here to form the curable underfill composition of the invention. Preferred epoxy resins include, for example, cycloaliphatic epoxy resins, such as 3,4-epoxycyclohexylmethyl-3,4-epoxycyclohexanecarboxylate. The anhydride curing agent preferably is used in approximately 1:1 stoichiometry with the epoxy resin. Preferred anhydride curing agents include, for example, hexahydrophthalic anhydride. The epoxy-based composition also contains an amine catalyst, such as benzyl dimethyl amine or the like. Numerous additional suitable amine catalysts are commercially available or otherwise known to those skilled in the art, and will be readily apparent in view of this disclosure. Without wishing to be bound by theory, it is currently believed that the alkyl-substituted imidazole or like additional component disclosed above, acts as a catalyst for the polymerization reaction between the epoxy resin and the anhydride curing agent. It may act as a co-catalyst with an amine catalyst. It should be understood, however, that the speed of cure is neither the objective nor good indicator of efficacy. That is, the increased glass transition temperature and reduced CTE are not achieved using merely an amine catalyst, without the substituted imidazole additional component disclosed here.

Additives, such as are routinely included in encapsulant formulations and other epoxy-based resinous materials, such as inorganic fillers, surfactants, etc., may also be employed in the curable underfill composition disclosed here. More generally, those skilled in the art will recognize that various modifications and adaptations can be made to the integrated circuit assembly disclosed here and/or the method of producing such assembly, without departing from the true scope and spirit of the invention. All such modifications and adaptations are intended to be included within the scope of the following claims.

I claim:

1. A curable underfill composition comprising cycloaliphatic epoxy resin and anhydride curing agent for the epoxy resin in substantially 0.9:1 to 1.1:1 reactive group ratio, amine catalyst for the curing reaction of the epoxy resin and anhydride curing agent, and from 0.05 to 3.0 weight percent of C1 to C7 substituted imidazole additive.

2. The curable underfill composition of claim 1 wherein the substituted imidazole additive is selected from mono- and dialkyl-substituted imidazole, each alkyl substitution group having from one to two carbons.

3. The curable underfill composition of claim 1 wherein the additive is present in the underfill composition in an amount from 0.1 to 2.0 weight percent and is selected from the group consisting of:

N-methyl-imidazole;

2-ethyl-4-methyl-imidazole;

2-methyl-imidazole;

4-methyl-imidazole;

1,2-dimethyl-imidazole; and 2-phenyl-imidazole.

4. The curable underfill composition of claim 1 wherein the amine catalyst for the curing reaction is benzyl dimethylamine.

5. The curable underfill composition of claim 1 wherein the epoxy resin is cycloaliphatic epoxy resin and the anhydride curing agent for the epoxy resin is used in substantially 1:1 stoichiometric ratio with the epoxy resin, the amine catalyst is used in an amount of from 0.05 to 5.0 weight percent and the substituted imidazole additive is 0.1 to 2.0 weight percent N-alkyl-imidazole.

6. The curable underfill composition of claim 5 wherein the cycloaliphatic epoxy resin is 3,4-epoxycyclohexylmethyl-3,4-epoxycyclohexanecarboxylate, the anhydride curing agent is hexahydrophthalic anhydride, the amine catalyst is benzyl dimethyl amine, and the N-alkyl-imidazole is N-methyl-imidazole.

* * * * *